United States Patent
Jin

(10) Patent No.: US 7,227,200 B2
(45) Date of Patent: Jun. 5, 2007

(54) METAL I/O RING STRUCTURE PROVIDING ON-CHIP DECOUPLING CAPACITANCE

(75) Inventor: Woo-jin Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 31 days.

(21) Appl. No.: 11/145,984

(22) Filed: Jun. 7, 2005

(65) Prior Publication Data

US 2006/0071241 A1    Apr. 6, 2006

(30) Foreign Application Priority Data

Oct. 2, 2004    (KR) .................... 10-2004-0078547

(51) Int. Cl.
*H01L 27/10* (2006.01)
(52) U.S. Cl. .................... 257/203; 257/207; 257/773; 257/E23.153
(58) Field of Classification Search ................ 257/203, 257/211, 758, 773, 207, E23.153
See application file for complete search history.

(56) References Cited

U.S. PATENT DOCUMENTS

| | | | |
|---|---|---|---|
| 5,789,807 A | * | 8/1998 | Correale, Jr. ............... 257/691 |
| 5,959,320 A | | 9/1999 | Torgerson et al. |
| 6,664,634 B2 | * | 12/2003 | Thompson et al. ......... 257/758 |
| 7,037,820 B2 | * | 5/2006 | Booth et al. ................ 438/618 |
| 2003/0161128 A1 | * | 8/2003 | Masuda ...................... 361/792 |

FOREIGN PATENT DOCUMENTS

| KR | 1020000003885 A | 1/2000 |
|---|---|---|
| KR | 2003-0069890 | 8/2003 |

\* cited by examiner

*Primary Examiner*—T. N. Quach
(74) *Attorney, Agent, or Firm*—Volentine & Whitt, PLLC

(57) ABSTRACT

There are provided a metal I/O ring structure for a semiconductor chip and a decoupling capacitance structure using the same. In the Metal I/O ring structure, a plurality of first metal lines are formed on a first metal layer and connected with a power supply voltage, and a plurality of second metal lines are formed on the first metal layer and connected with a ground voltage. The second metal lines are arranged neighboring to the first metal lines. The second metal lines are connected with a second metal layer disposed below the first metal lines on the metal layer, and the first metal lines are connected with the second metal layer disposed below the second metal lines on the first metal layer. An insulating layer is disposed between the first metal layer and the second metal layer, thereby forming a decoupling capacitance between the first metal lines and the second metal lines.

19 Claims, 15 Drawing Sheets

FRONT VIEW

CROSS-SECTION VIEW

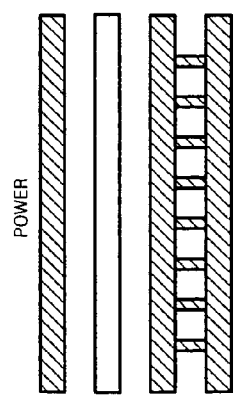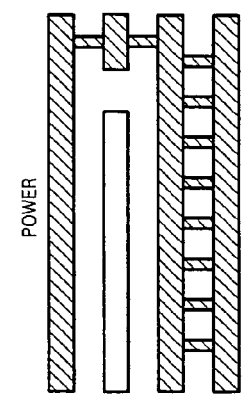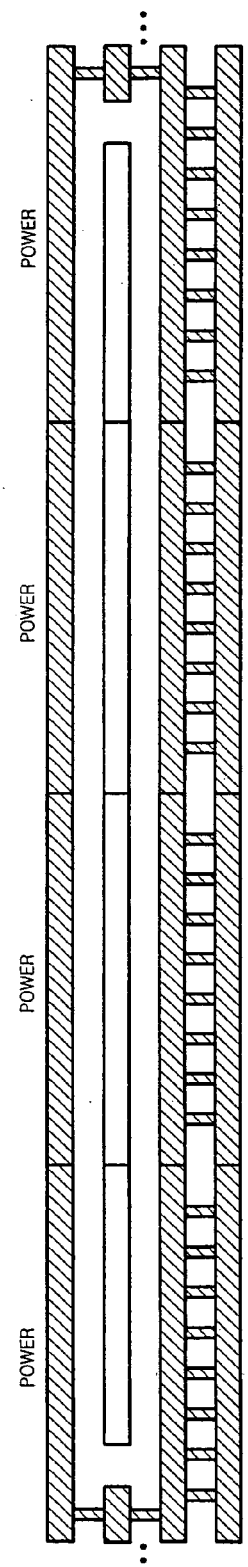

METAL I/O RING STRUCTURE PROVIDING ON-CHIP DECOUPLING CAPACITANCE

BACKGROUND OF THE INVENTION

1. Field of the Invention

The present invention relates generally to a semiconductor device. More particularly, the invention relates to a metal input/output (I/O) ring structure for a semiconductor device.

This application claims the priority of Korean Patent Application No. 10-2004-0078547 filed on Oct. 2, 2004, the disclosure of which is hereby incorporated by reference in its entirety.

2. Description of the Related Art

As process technology for semiconductor devices continues to improve, the operating speed and the degree of integration for the devices increases accordingly. Due to a continuing increase in the size of semiconductor chips, the number of pads used in semiconductor chips can range from several hundreds to more than one thousand. However, in order to minimize power consumption, the typical size of a power source supplied to the chips tends to become smaller and smaller. As a result, the typical noise margin for semiconductor chips is continually reduced, thereby deteriorating the overall performance of systems using the semiconductor chips.

Effective noise reduction can cause a dramatic improvement in the performance of a semiconductor system. For example, simultaneous switching noise (SSN) resulting from a disrupted power distribution in a package and/or a printed circuit board (PCB) of a semiconductor system can be reduced by including several power/ground pins in the system and making sure that the power/ground pins are adequately spread out. Unfortunately, reducing SSN in this way causes a problem in that it tends to increase chip size and package manufacturing cost. As a result, SSN is often reduced by a method involving an on-chip decoupling capacitance.

A conventional technique for providing on-chip decoupling capacitance has been realized with metal oxide semiconductor (MOS) transistors. Unfortunately, using this type of decoupling capacitance tends to have a negative effect on system performance due to associated leakage currents. Also, it is extremely difficult to manufacture a sufficiently large decoupling capacitance due to limited on-chip space. In addition, in cases where a conventional metal I/O ring is used, although the metal element used for the power supply generally has a width of at least 100 μm, only a capacitance between adjacent metal rings is used for a decoupling capacitance. Hence it is difficult to provide a decoupling capacitance of more than several picofarads. Finally, it is difficult to make adjustments to the structure of the metal I/O ring to obtain a desired capacitance.

FIG. 1 is a schematic view of a conventional I/O cell. Referring to FIG. 1, an I/O cell is constructed to have a metal ring structure providing a steady power/ground supply. In FIG. 1, metal lines for power cells and metal lines for ground (GND) cells are alternately arranged in a horizontal direction, and the power and ground cells are interconnected to form a ring structure surrounding a semiconductor device.

FIG. 2 is a cross-sectional view of a metal ring structure for a conventional I/O cell. Referring to FIG. 2, a conventional metal I/O ring structure comprises a plurality of power cells 22 and 24 and a plurality of ground cells 21 and 23 alternately arranged along a horizontal direction, with power cells and ground cells adjacent to each other. The power cells and the ground cells are isolated from each other by an electrical insulator interposed therebetween and hence a decoupling capacitance is formed between horizontally adjacent ground and power cells.

The power cells and the ground cells each have a plurality of vertically-layered metal lines connected by a plurality of vias 26 interposed therebetween as shown in FIG. 2. Each of the metal lines within a cell has the same voltage. For example, in a power cell, the plurality of metal lines is connected to a power source voltage, and in a ground cell, the plurality of metal lines is connected to ground.

In FIG. 2, ground cell 21 comprises a ground metal line M6 and a ground metal line M5 located below metal line M6. Ground metal lines M5 and M6 are connected by vias 26 interposed therebetween. Ground cell 21 further comprises a ground metal line M4 located below metal line M5 and a ground metal line M3 located below ground metal line M4. Ground metal lines M5 and M4 and M4 and M3 are respectively connected by vias 26 interposed therebetween. Power cell 22 also comprises power metal lines M6, M5, M4, and M3, where power metal line M5 is located below power metal line M6, power metal line M4 is located below power metal line M5, and power metal line M3 is located below power metal line M4. Each of power metal lines M6, M5, M4, and M3 is connected to vertically adjacent power metal lines by vias 26 interposed therebetween.

A capacitor 25 is placed between ground metal line M3 and power metal line M3 to provide a decoupling capacitance.

FIG. 3 is a top view of the metal ring structure of the conventional I/O cell shown in FIG. 2. Referring to FIG. 3, ground metal lines and power metal lines are alternately arranged, and vertically adjacent layered metal lines are connected by vias 26 interposed therebetween.

As shown in FIGS. 2 and 3, in a conventional metal I/O ring structure, the metal layers of a ground or power cell are vertically connected by vias interposed therebetween and a capacitor is placed between horizontally adjacent ground and power metal lines of the same layer in order to provide a decoupling capacitance. As previously mentioned, one of the shortcomings of the conventional metal I/O ring structure is that the capacitor does not exceed several picofarads (pfs).

SUMMARY OF THE INVENTION

The present invention provides a metal I/O ring structure for a semiconductor chip. The metal I/O ring structure is adapted to provide a decoupling capacitance sufficient to prevent simultaneous switching noise (SSN). The metal I/O ring structure also allows the decoupling capacitance to be adjusted to a desired amount.

According to one embodiment of the present invention, a metal I/O ring structure for a semiconductor device comprises a first metal layer, a second metal layer, and an insulating layer interposed between the first metal layer and the second metal layer. The insulating layer forms a decoupling capacitance between power metal lines and ground metal lines on the first and second metal layers. The power metal lines formed on the first and second metal layers are connected to a power supply and the ground metal lines formed on the first and second metal layers are connected to ground. Each of the ground metal lines on the first and second metal layers is horizontally adjacent to at least one of the power metal lines, and vertically adjacent to at least on of the power metal lines.

According to another embodiment of the present invention, an on-chip decoupling capacitance structure is provided. The on-chip decoupling capacitance structure comprises a first region having an even layer on which a metal line of a first type is formed and an odd layer on which a metal line of a second type is formed. The on-chip decoupling capacitance further comprises a second region having an even layer on which a metal line of a second type is formed and an odd layer on which a metal line of the second type is formed, and an insulating layer interposed between the layers on which the metal lines are formed. The insulating layer forms a decoupling capacitance between the first metal lines of the first type and the metal lines of the second type. The metal lines of the first type in the first and second regions are connected together and the metal lines of the second type in the first and second regions are connected together.

According to one embodiment, each of the first and second regions further comprises a lower most and an upper most metal layer having metal lines formed thereon. The upper most metal layer of the first region is of the same type as the lower most metal layer of the first region and the upper most metal layer of the second region is of the same type as the lower most metal layer of the second region.

BRIEF DESCRIPTION OF THE DRAWINGS

The invention is described below in relation to several embodiments illustrated in the accompanying drawings. Throughout the drawings like reference numbers indicate like exemplary elements, components, or steps, and the thicknesses of layers and regions are exaggerated for clarity. In the drawings.

DETAILED DESCRIPTION OF THE INVENTION

Exemplary embodiments of the invention are described below with reference to the corresponding drawings. These embodiments are presented as teaching examples. The actual scope of the invention is defined by the claims that follow.

Figure 1:
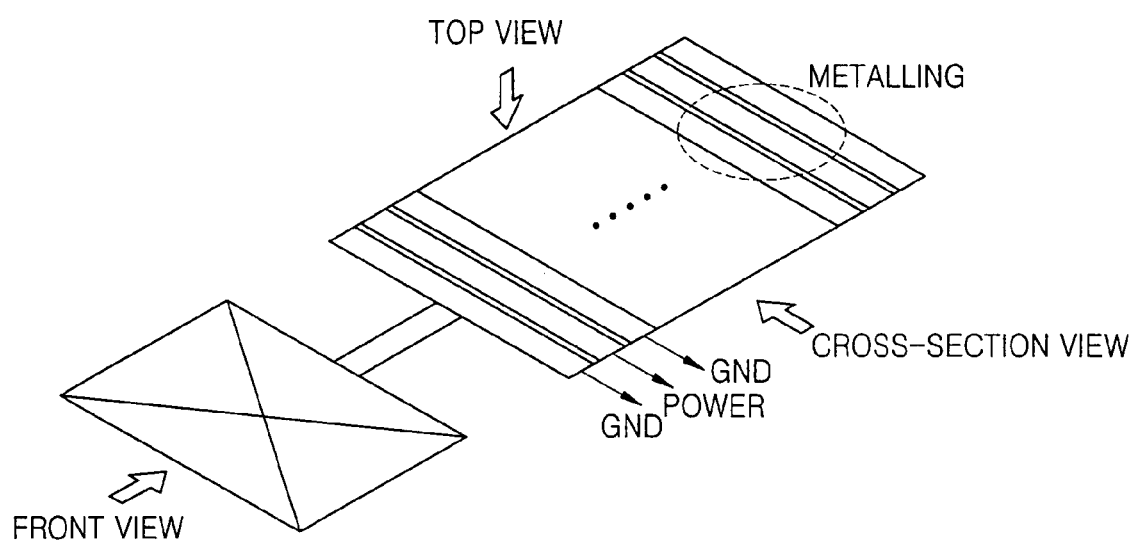
FIG. 1 is diagram illustrating a conventional I/O cell.
Figure 2:
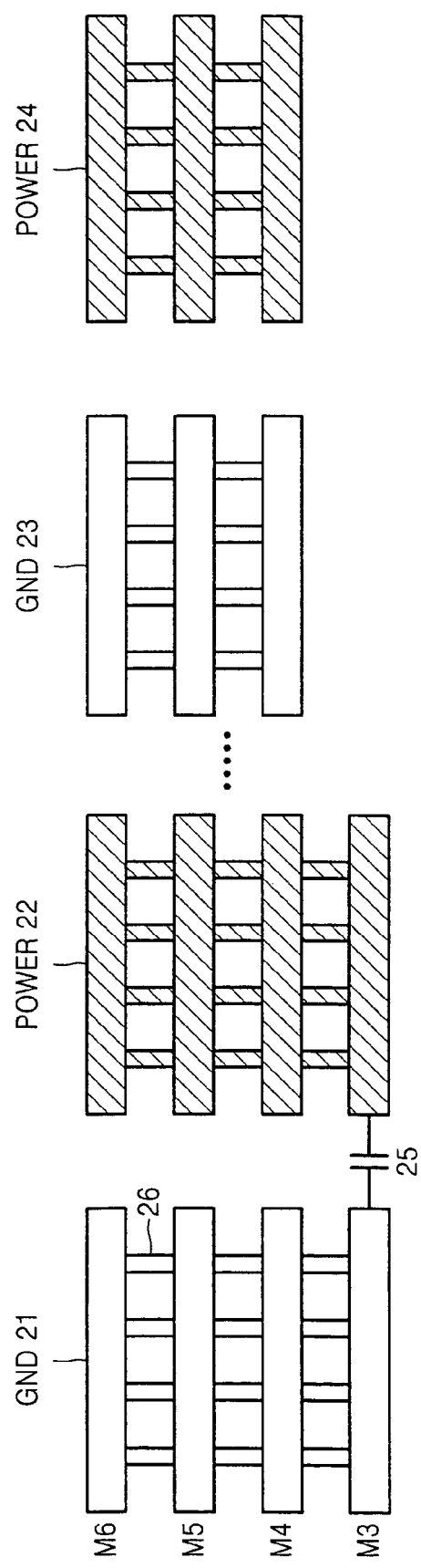
FIG. 2 is a cross-sectional view of a metal ring structure in a conventional I/O cell.
Figure 3:
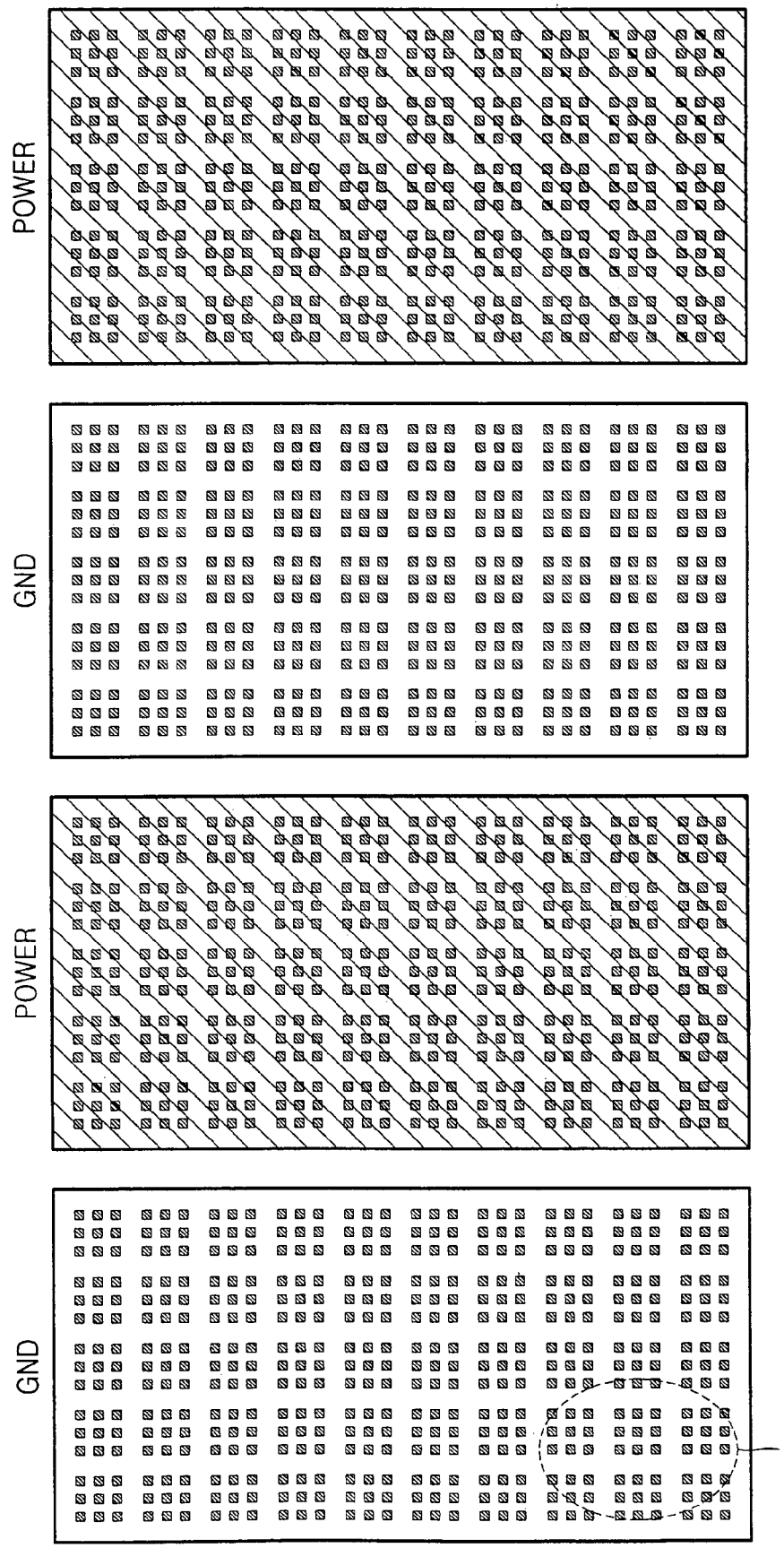
FIG. 3 is a top view of the metal ring structure in the conventional I/O cell shown in FIG. 2.
Figure 4:
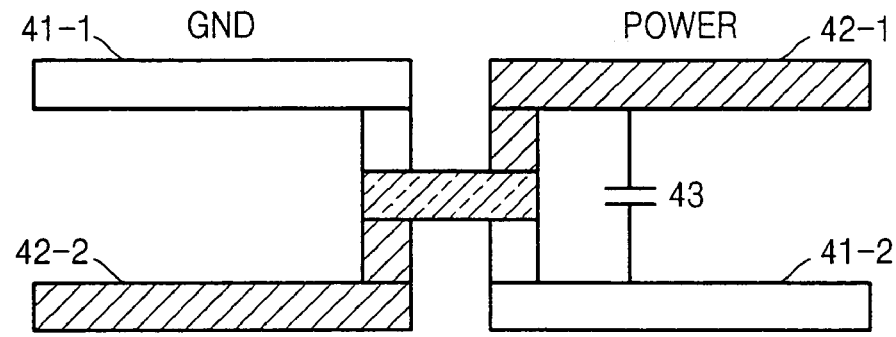
FIG. 4 is a side view of a metal I/O ring structure according to one embodiment of the present invention.

FIG. 4 is a side view of a metal I/O ring structure according to one embodiment of the present invention.

Referring to FIG. 4, a ground metal line 41-1 is formed on one side of a first metal layer and a power metal line 42-1 is formed on another side of the first metal layer. A power metal line 42-2 is formed below first ground metal line 41-1 and a ground metal line 41-2 is formed below power metal line 42-1, thus forming a second metal layer below the first metal layer.

In the first metal layer, metal line 41-1 is connected to ground and metal line 42-1 is connected to a power source. In the second metal layer, power metal line 42-2 is connected to power metal line 42-1, and ground metal line 41-2 is connected to ground metal line 41-1. An insulator is interposed between the first metal layer and the second metal layer and a decoupling capacitor 43 is formed between ground metal line 41-2 and power metal line 42-1. The decoupling capacitor can be manufactured to have a desired capacitance by using a plate capacitor.

Ground metal line 41-1 is diagonally connected to ground metal line 41-2 and power metal line 42-1 is diagonally connected to power metal line 42-2 at an intersection between the first and second metal layers. Metal lines 41-1 and 42-2 and metal lines 42-1 and 41-2 each have sawtoothed protrusions and grooves that are respectively interdigitated with each other as illustrated, for example, in FIG. 5. The saw-toothed protrusions of the first and second metal layers are connected to each other by vias as will be described hereafter.

In a broader case extending on the embodiment shown in FIG. 4, the first and second metal layers may each comprise a plurality of ground metal lines and a plurality of power metal lines. Typically, each of the ground metal lines in the first and second metal layers is horizontally adjacent to at least one of the power metal lines and vertically adjacent to at least one of the power metal lines. For example, ground metal line 41-1 is horizontally adjacent to power metal line 42-1 and vertically adjacent to power metal line 42-2. In addition, the pluralities of ground metal lines and power metal lines in each of the first and second metal layers may be laid out in an alternating arrangement, meaning that where more than two metal lines are present in one of the metal layers, successive metal lines are arranged to alternate between a ground metal line, a power metal line, and so forth.

Figure 5:
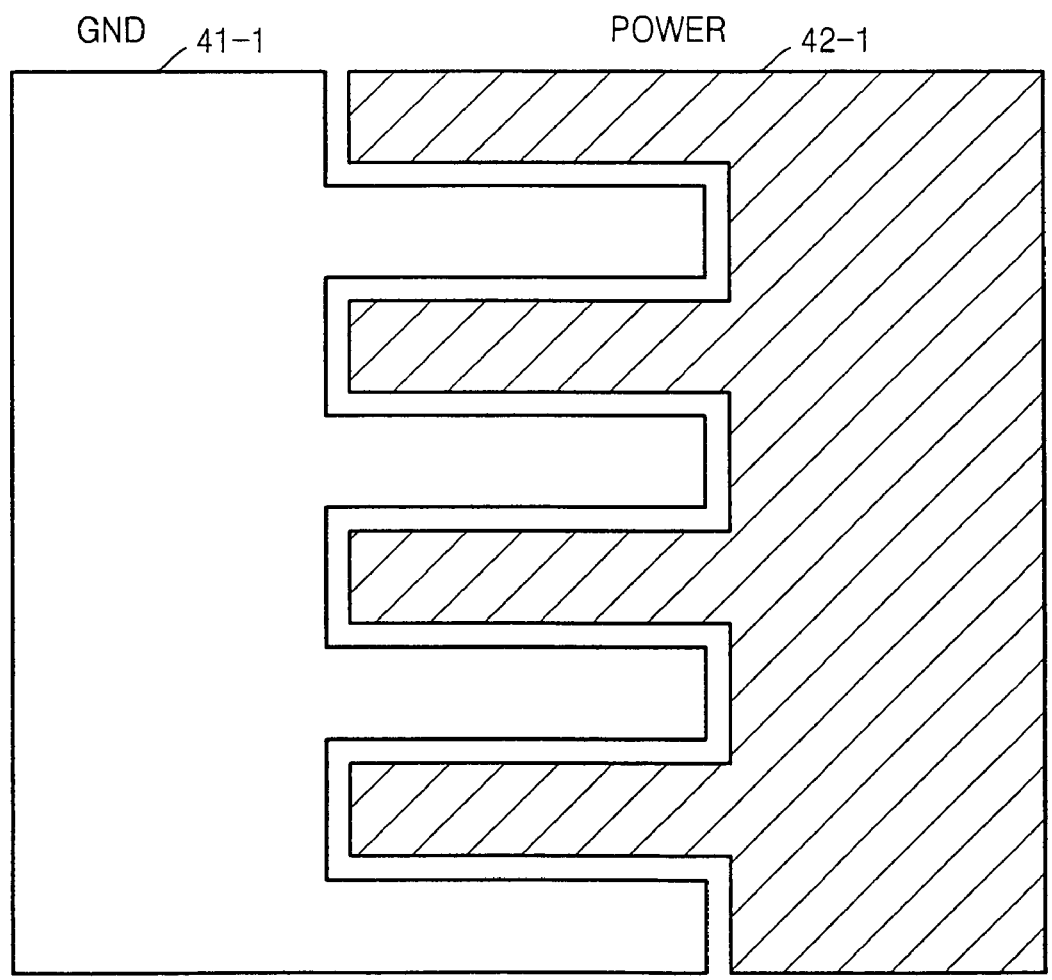
FIG. 5 is a top view of the metal I/O ring structure shown in FIG. 4 according to one embodiment of the present invention.

FIG. 5 is a top view of the metal I/O ring structure shown in FIG. 4, according to one embodiment of the present invention.

Referring to FIGS. 4 and 5, the saw-toothed protrusions of ground metal line 41-1 are interdigitated with the saw-toothed protrusions of power metal line 42-1 and the saw-toothed protrusions of ground metal line 41-2 are interdigitated with the saw-toothed protrusions of power metal line 42-2. The respective saw-toothed protrusions of ground line 41-1 and ground line 41-2 and the saw-toothed protrusions of power metal line 42-1 and power metal line 42-2 are connected with each other as illustrated in FIG. 6.

Figure 6:
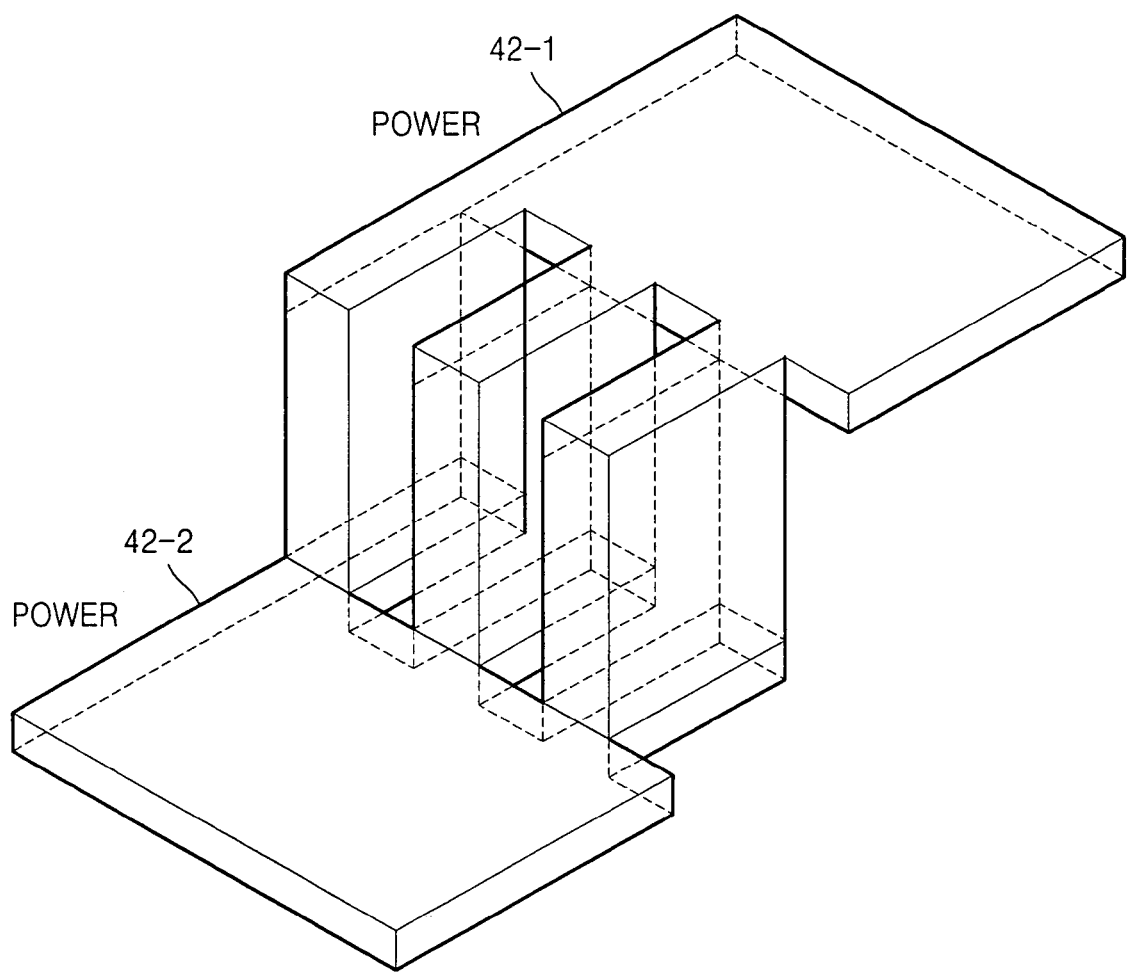
FIG. 6 is a perspective view illustrating a connecting structure for metal lines shown in FIG. 5.

FIG. 6 is a perspective view illustrating a connecting structure for the metal lines shown in FIG. 5. For simplicity and clarity of illustration, only power metal lines 42-1 and 42-2 are shown in FIG. 6 while ground metal lines 41-1 and 41-2 are omitted.

Referring to FIG. 6, power metal line 42-1 and power metal line 42-2 each have saw-toothed protrusions. Each protrusion of power metal line 42-1 is vertically aligned and connected with a corresponding protrusion of power metal line 42-2. The protrusions of power metal line 42-1 extend horizontally and vertically, while the protrusions of power metal line 42-2 extend horizontally. The respective protrusions of power metal line 42-1 and power metal line 42-2 are connected vertically.

In the embodiment corresponding to FIG. 6, ground metal lines 41-1 and 41-2 have the same connecting structure as that of power metal lines 42-1 and 42-2. Ground metal lines 41-1 and 41-2 are connected with each other through groove spaces formed between the connected saw-toothed protrusions of power metal lines 42-1 and 42-2.

Figure 7:
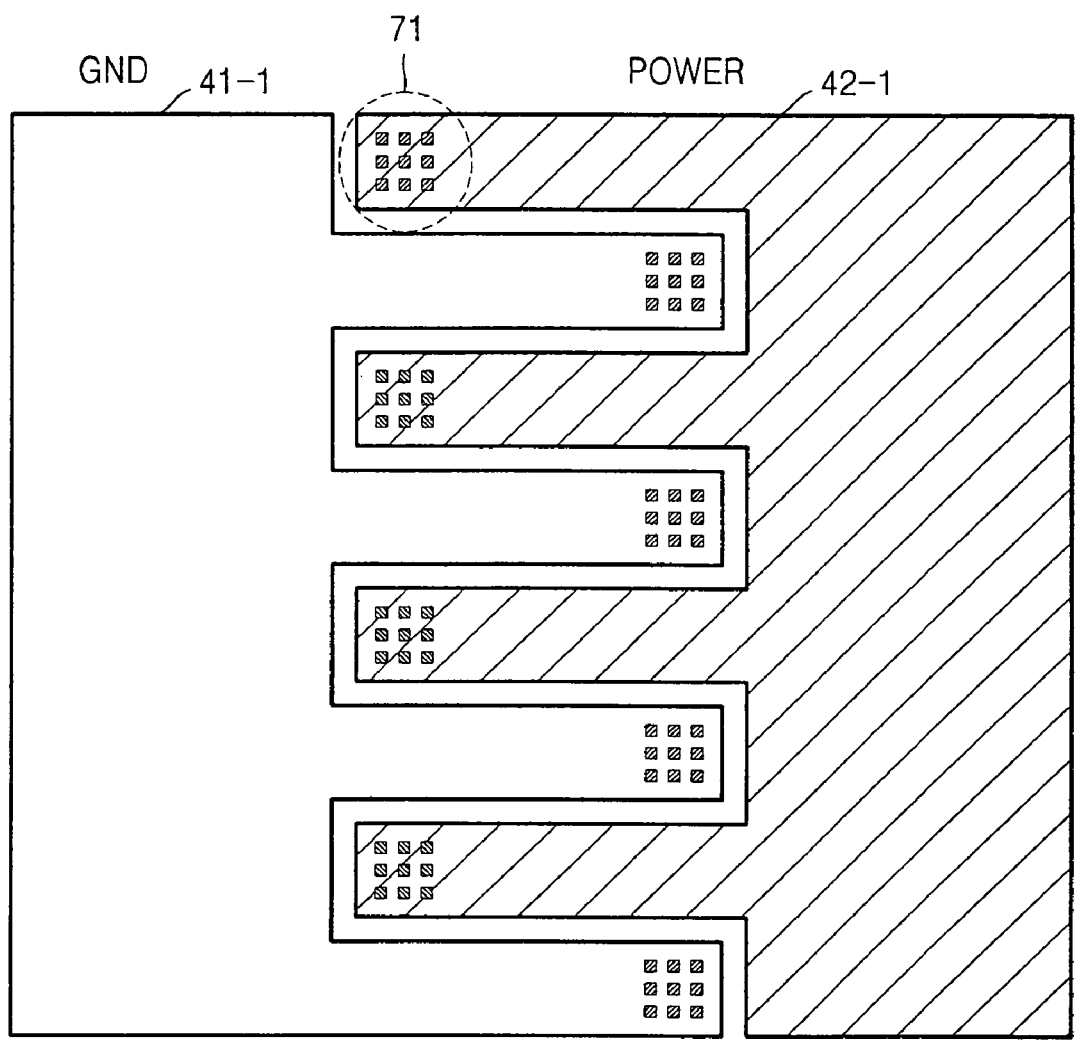
FIG. 7 is a top view of the metal I/O ring structure shown in FIG. 4, according to another embodiment of the present invention.

FIG. 7 is a top view of the metal I/O ring structure shown in FIG. 4 according to another embodiment of the present invention.

Referring to FIGS. 4 and 7, the saw-toothed protrusions of ground metal line 41-1 are interdigitated with the saw-toothed protrusions of power metal line 42-1, and the saw-toothed protrusions of ground metal line 41-2 are interdigitated with the saw-toothed protrusions of power metal line 42-2. The saw-toothed protrusions of power metal line 42-1 are connected to the saw-toothed protrusions of power metal line 42-2 and the saw-toothed protrusions of ground metal line 41-1 are connected to the saw-toothed protrusions of ground metal line 41-2 by vias 71 interposed between the respective protrusions.

Figure 8:
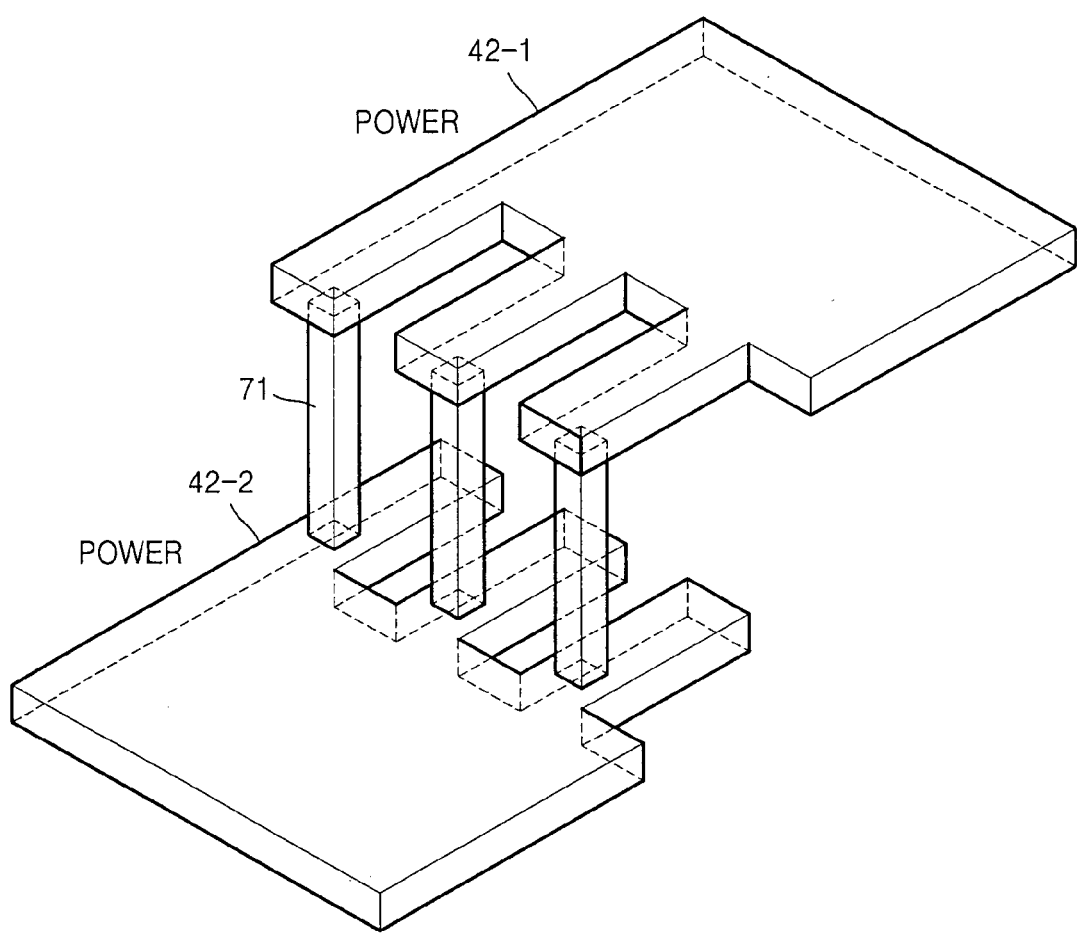
FIG. 8 is a perspective view illustrating a connecting structure for metal lines shown in FIG. 7.

FIG. 8 is a perspective view illustrating a connecting structure for the metal lines shown in FIG. 7. For simplicity and clarity of illustration, only power metal lines 42-1 and 42-2 are shown in FIG. 8 while ground metal lines 41-1 and 41-2 are omitted.

Referring to FIG. 8, power metal line 42-1 and power metal line 42-2 each have saw-toothed protrusions. Each protrusion of power metal line 42-1 is vertically aligned and connected with a corresponding protrusion of power metal line 42-2. In this case, the protrusions of power metal lines 42-1 and 42-2 are stick-shaped.

In the embodiment corresponding to FIG. 8, ground metal lines 41-1 and 41-2 have the same connecting structure as that of power metal lines 42-1 and 42-2. Ground metal lines 41-1 and 41-2 are connected with each other through grooves formed between the saw-toothed protrusions of power metal lines 42-1 and 42-2.

Figure 9:
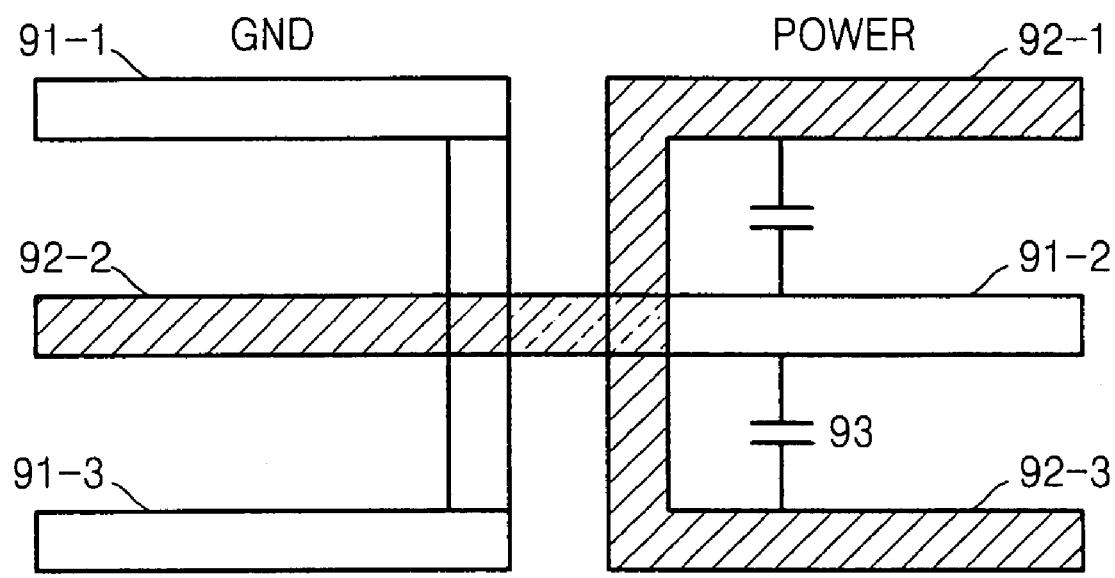
FIG. 9 is a side view of a metal I/O ring structure according to another embodiment of the present invention.

FIG. 9 is a side view of a metal I/O ring structure according to another embodiment of the present invention.

Referring to FIG. 9, a ground metal line 91-1 is formed on a first side of a first metal layer, a power metal line 92-2 is formed in a second metal layer below ground metal line 91-2, and a ground metal line 91-3 is formed in a third metal layer below power metal line 92-2.

A power metal line 92-1 is formed on a second side of the first metal layer, a ground metal line 91-2 is formed in the second metal layer located below power metal line 92-1, and a power metal line 92-3 is formed in the third metal layer below ground metal line 91-2. Since ground metal line 91-2 is formed between power metal lines 92-1 and 92-3, a larger decoupling capacitance 93 can be formed between power metal lines 92-1 and 92-3.

Electrical insulators are formed between the first, second and third metal layers. Ground metal lines 91-1 and 91-3 are diagonally connected to the ground metal line 91-2, and power metal line 92-2 is diagonally connected with power metal lines 92-1 and 92-3, the connected portions forming an intersection between the first, second and third metal layers. Saw-toothed protrusions and corresponding grooves in respective metal lines 91-1, 92-2 and 91-3 and metal lines 92-1, 91-2 and 92-3 on opposite sides of the metal I/O ring structure are interdigitated with respect to each other. The saw-toothed protrusions of the metal layers are connected with the saw-toothed protrusions of adjacent layers by vias interposed therebetween.

A capacitance of several tens of pfs can be easily obtained by the metal I/O ring structure shown in FIG. 9.

Figure 10:
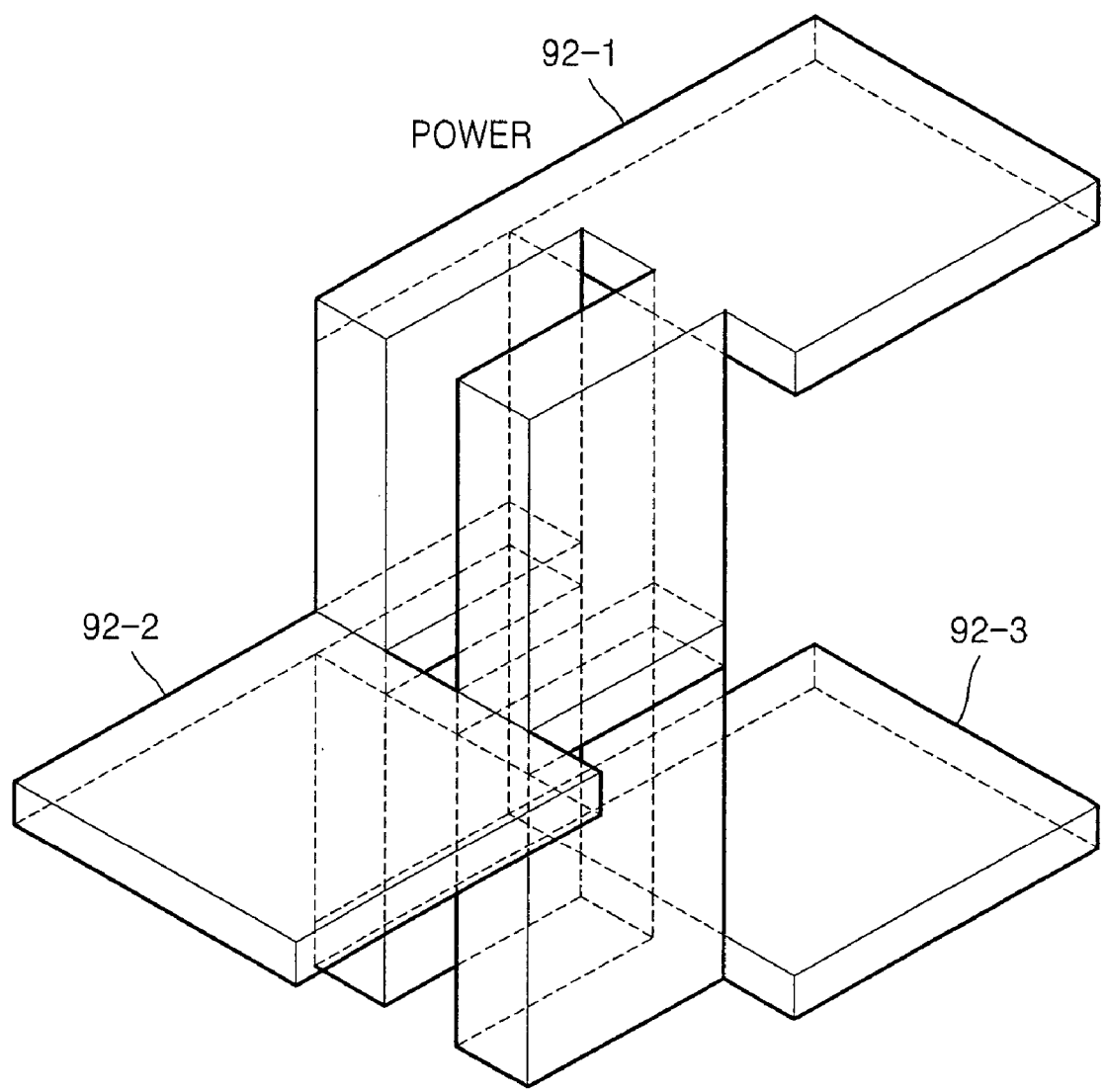
FIG. 10 is a perspective view of the metal ring structure shown in FIG. 9 according to one embodiment of the present invention.

FIG. 10 is a perspective view of the metal ring structure shown in FIG. 9. For clarity and simplicity of illustration, FIG. 10 shows power metal lines 92-1, 92-2 and 92-3, while ground metal lines 91-1, 91-2, and 91-3 are omitted. Ground metal lines 91-1, 91-2 and 91-3 have the same connecting structure as that of power metal lines 92-1, 92-2, and 92-3 shown in FIG. 10. Ground metal lines 91-1, 91-2, and 91-3 are connected through empty space or grooves between connecting parts of the power metal lines.

Referring to FIG. 10, power metal lines 92-1, 92-2 and 92-3 each have vertically aligned saw-toothed protrusions. The protrusions are connected with each other at the first, second and third metal layers.

In addition, grooves are formed around the connected parts of power metal lines 92-1, 92-2 and 92-3, and ground metal lines 91-1, 91-2 and 91-3 are connected with one another through the grooves.

Figure 11:
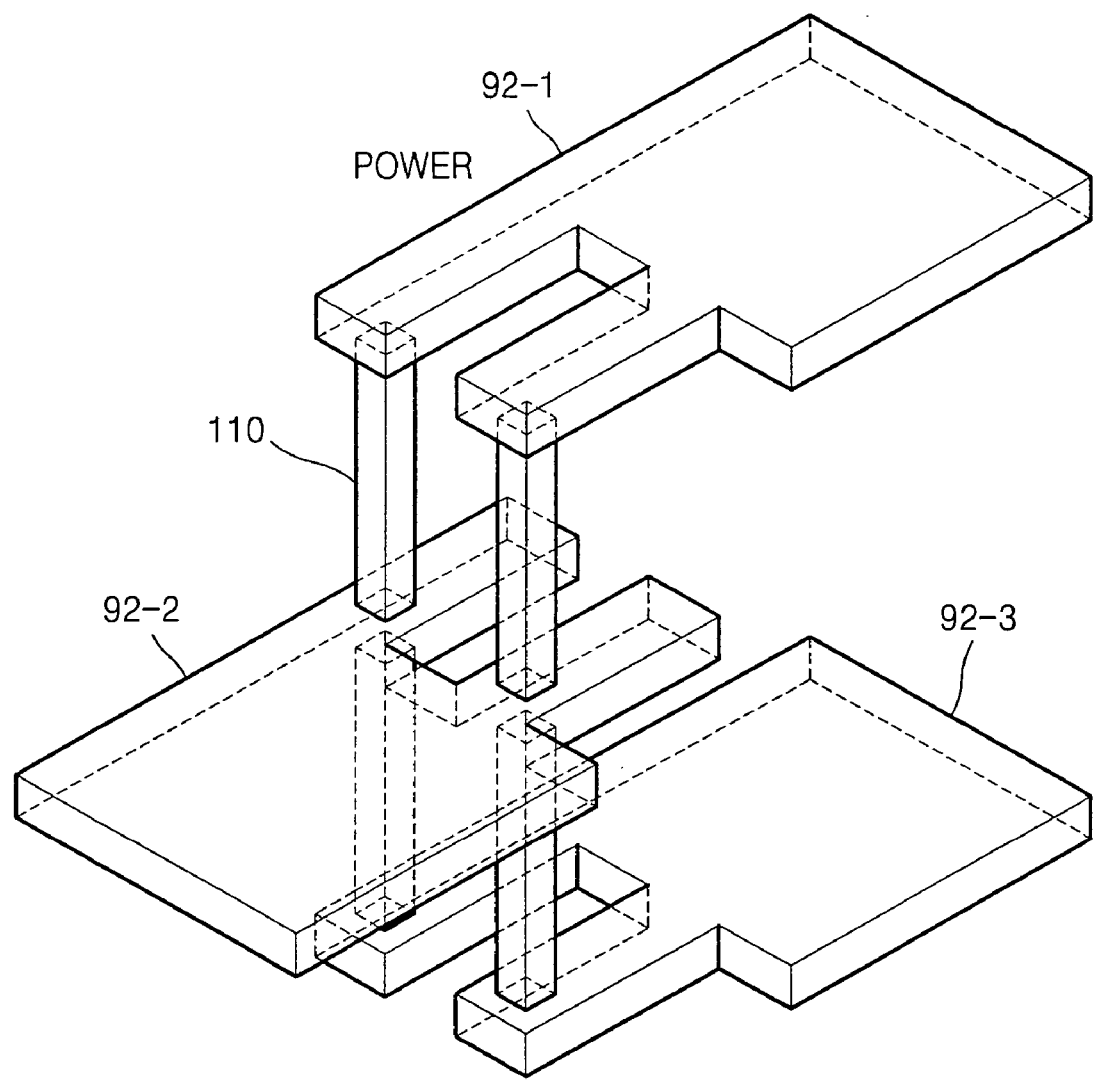
FIG. 11 is a perspective view of the metal ring structure shown in FIG. 9 according to another embodiment of the present invention.

FIG. 11 is a perspective view of the metal I/O ring structure shown in FIG. 9 according to another embodiment of the present invention. For clarity and simplicity of illustration, FIG. 11 only shows power metal lines 92-1, 92-2 and 92-3 while ground metal lines 91-1, 91-2, and 91-3 are omitted.

Referring to FIG. 11, power metal lines 92-1, 92-2, and 92-3 each have saw-toothed protrusions. Each saw-toothed protrusion of power metal line 92-1 is vertically aligned and connected with a corresponding saw-toothed protrusion of power metal line 92-2 and each saw-toothed protrusion of line 92-2 is vertically aligned and connected with a corresponding protrusion of power metal line 92-3. All of the saw-toothed protrusions for metal lines 92-1, 92-2, and 92-3 are stick-shaped.

Ground metal lines 91-1, 91-2 and 91-3 shown in FIG. 9 have the same connecting structure as that of power metal lines 92-1, 92-2 and 92-3. Ground metal lines 91-1, 91-2, and 91-3 are connected with each other in empty space formed between the saw-toothed protrusions of power metal lines 92-1, 92-2 and 92-3.

Figure 12:
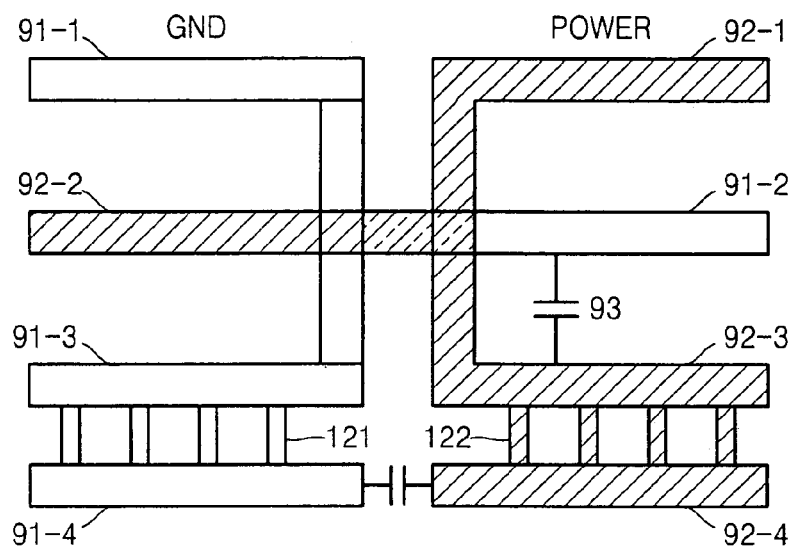
FIG. 12 is a side view of a metal I/O ring structure according to still another embodiment of the present invention.

FIG. 12 is a side view of a metal I/O ring structure according to still another embodiment of the present invention.

Compared to the metal I/O ring structure illustrated in FIG. 9, the metal I/O ring structure of FIG. 12 is constructed to further include a fourth metal layer in which the same kind of metal lines is formed using vias 121 and 122. In other words, a ground metal line 91-4 in the fourth metal layer is connected to a lower side of ground metal line 91-3 by via 121, and a power metal line 92-4 in the fourth metal layer is connected to a lower side of power metal line 92-3 by via 122.

Figure 13:
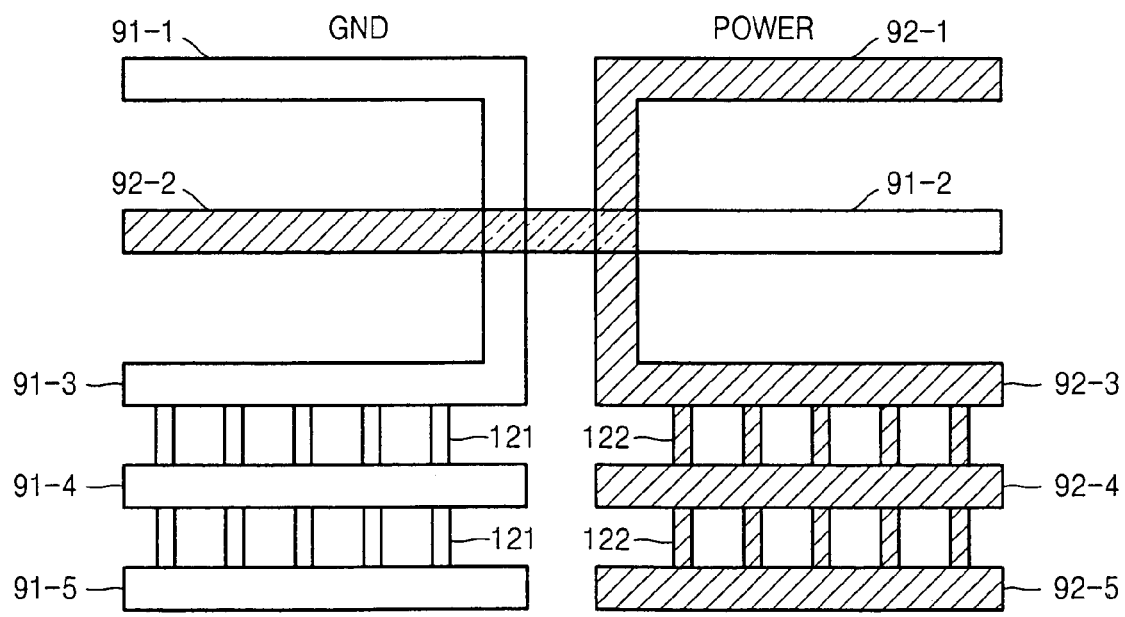
FIG. 13 is a side view illustrating a modification of the metal I/O ring structure shown in FIG. 12.

FIG. 13 is a side view illustrating a modification to the Metal I/O ring structure shown in FIG. 12.

Compared to the Metal I/O ring structure of FIG. 12, the Metal I/O ring structure of FIG. 13 is constructed to further include a fifth metal layer in which the same kind of metal lines are formed using vias 121 and 122. In other words, a ground metal line 91-5 in the fifth metal layer is connected to a lower side of the ground metal line 91-4 by the via 121, and a power metal line 92-5 in the fifth metal layer is connected to a lower side of the power metal line 92-4 by via 122.

Figure 14:
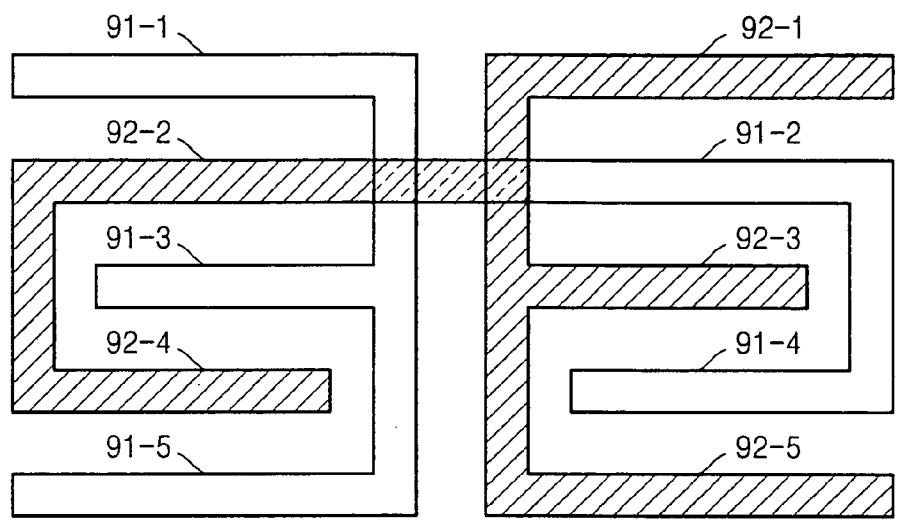
FIG. 14 is a side view illustrating another modification of the metal I/O ring structure shown in FIG. 12.

FIG. 14 is a view illustrating another modification to the Metal I/O ring structure shown in FIG. 12.

Referring to FIG. 14, ground metal lines 91-1, 91-3 and 91-5 are formed in odd-numbered metal layers on a first side of a metal ring, and power metal lines 92-2 and 92-4 are formed in even-numbered metal layers of the first side of the metal ring. Power metal lines 92-1, 92-3 and 95-5 are formed in odd-numbered metal layers of a second side of the metal ring, and ground metal lines 91-2 and 91-4 are formed in even-numbered metal layers of the second side of the metal ring. Ground metal lines 91-1 through 91-5 are all connected to one another, and power metal lines 92-1 through 92-5 are likewise all connected to one another. Insulators are interposed between the metal lines, thereby forming a decoupling capacitance between the ground metal line and the power metal line.

Compared to the metal ring structures of FIGS. 4, 9 and 10, the metal ring structures of FIGS. 12 through 14 each use more metal layers to thereby generate a larger capacitance.

In the embodiments illustrated in FIGS. 4 through 14, it is preferable that an uppermost metal layer and a lowermost metal layer are constructed of the same type of metal lines so that the metal ring structures can be smoothly connected to a semiconductor device.

For example, in the metal ring structures illustrated in FIGS. 9 and 12 through 14, uppermost and lowermost metal layers for one side of a metal ring structure are constructed by ground metal lines, and uppermost and lower most metal layers of the other side of the metal ring structure are constructed by power metal lines.

Figure 15:
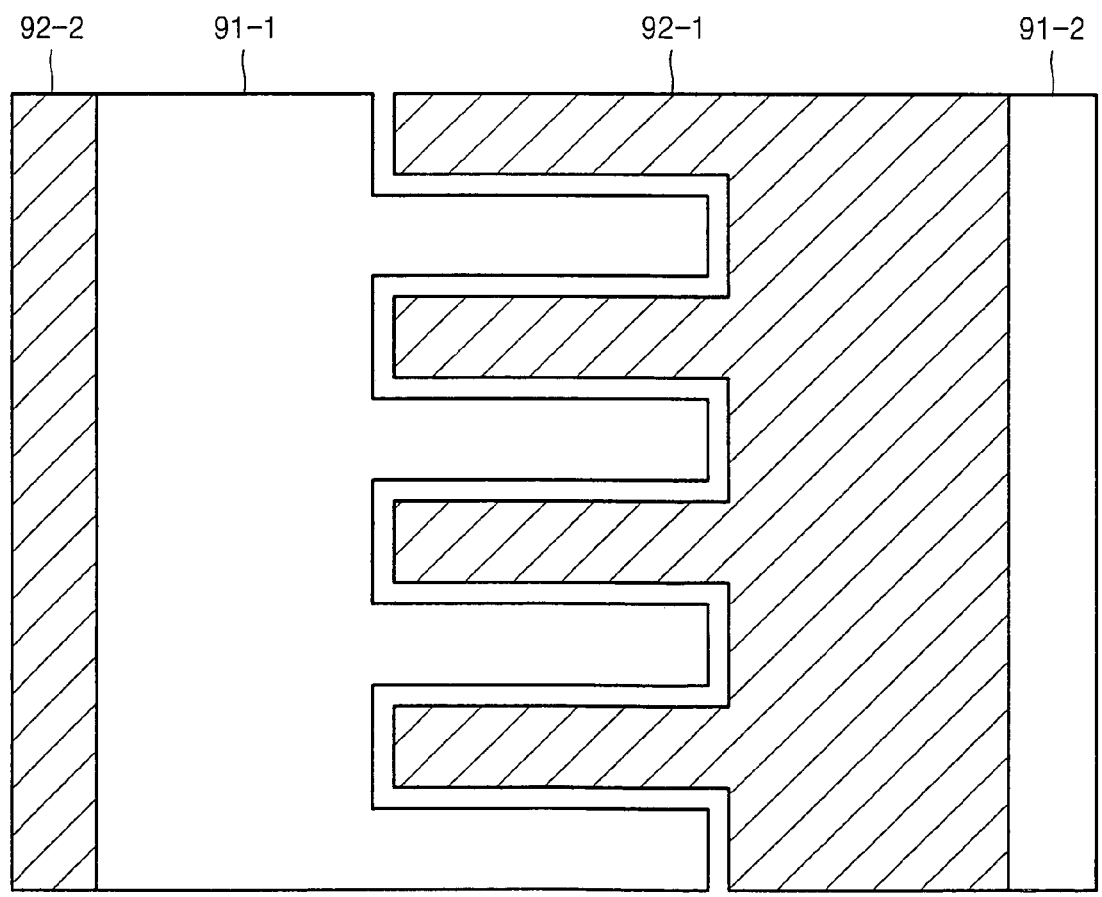
FIG. 15 is a top view of the metal I/O ring structure shown in FIG. 14.

FIG. 15 is a top view of the metal ring structure shown in FIG. 14.

Referring to FIG. 15 a ground metal line 91-1 and a power metal line 92-1 in a first metal layer each have saw-toothed protrusions which are interdigitated and extended so as to be connected to the same kinds of metal lines in a second metal layer. In other words, ground metal line 91-1 and power metal line 92-1 are connected to metal lines in the second metal layer by the saw-toothed protrusions of metal lines 91-1 and 92-1.

In some cases, two metal lines of the same type are not intersected by a metal line of another type, but instead, one of the two metal lines of the same type is extended around the metal line of the other type and then connected to the other of the two metal lines of the same type. For example, power metal line 92-2 is extended around ground metal line 91-3 and then connected to power metal line 92-4, and the ground metal line 91-2 is extended around the power metal line 92-3 and then connected to the ground metal line 91-4. Accordingly, the connected power metal lines of one type form a rectangular (□) structure or a U shaped structure (e.g. a structure with a shape such as ⊃ or ⊂) surrounding a ground metal line.

Figure 16:
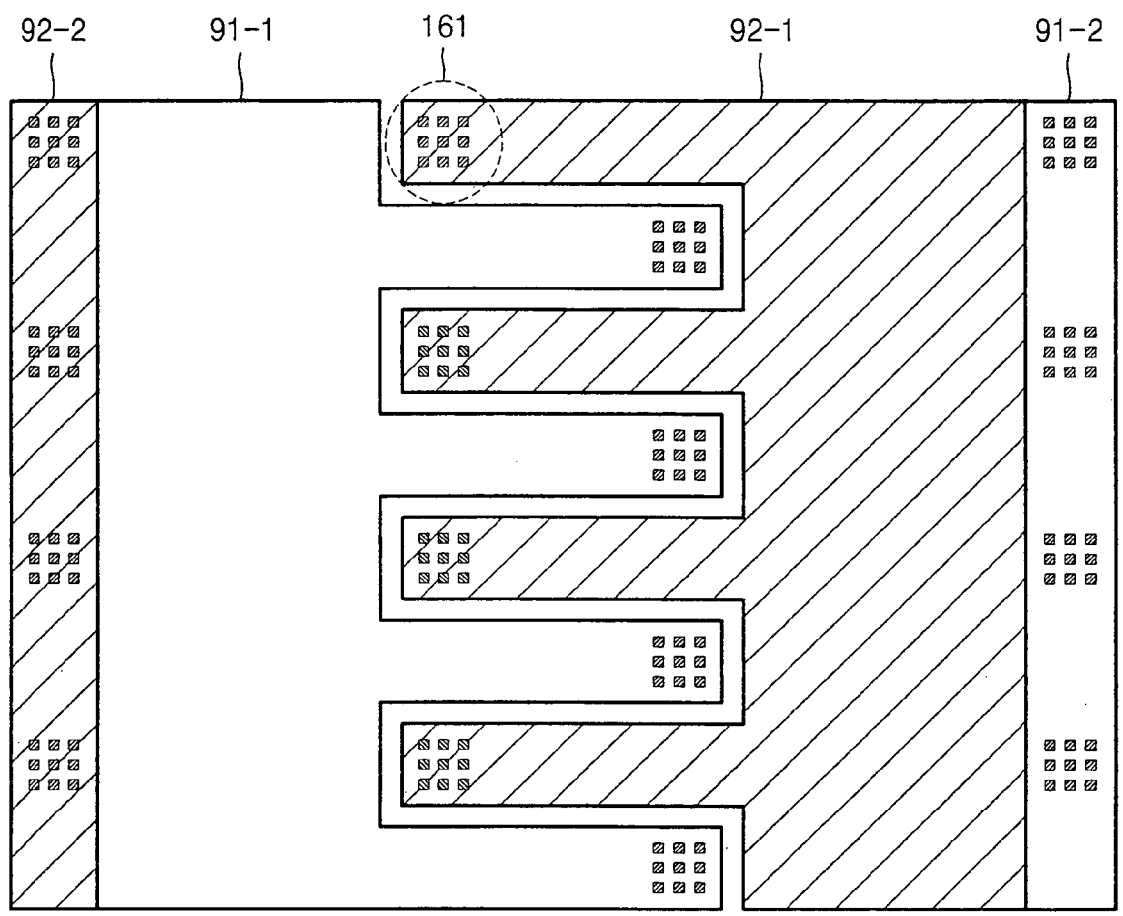
FIG. 16 is a top view of the metal I/O ring structure shown in FIG. 14 according to another embodiment of the present invention.

FIG. 16 is a top view of the metal ring structure shown in FIG. 14 according to another embodiment of the present invention.

Referring to FIG. 16, ground metal line 91-1 and power metal line 92-1 of the first metal layer are respectively extended over power metal line 92-2 and ground metal line 91-2 of the second metal layer. The saw-toothed protrusions of ground metal line 91-1 and power metal line 92-1 are interdigitated with each other, and the saw-toothed grooves of power metal line 92-1 are connected with the saw-toothed grooves of power metal line 92-2 by vias 161. Likewise, the saw-toothed protrusions of ground metal line 91-1 are also connected with the saw-toothed protrusions of ground metal line 91-2 by vias 161. Other layers in the metal ring structure are likewise interdigitated and connected with respective horizontally and vertically adjacent lines.

In some cases, two metal lines of the same type are not intersected by a metal line of another type, but instead, one of the two metal lines of the same type is extended around the metal line of the other type and then connected to the other of the two metal lines of the same type. For example, as shown in FIG. 14, power metal line 92-2 may be extended around ground metal line 91-3 and then connected to power metal line 92-4, and ground metal line 91-2 may be extended around power metal line 92-3 and then connected to ground metal line 91-4. Accordingly, the connected power metal lines form a rectangular (□) structure or a U shaped structure (e.g. a structure with a shape such as ⊃ or ⊂) to thereby surround the ground metal line.

Decoupling capacitance of difference sizes can be manufactured as illustrated in FIGS. 4, 9, and 12 through 14. An accurate size for a decoupling capacitance can be obtained by using the metal I/O ring structure illustrated in FIGS. 17A and 17B.

Figure 17A:
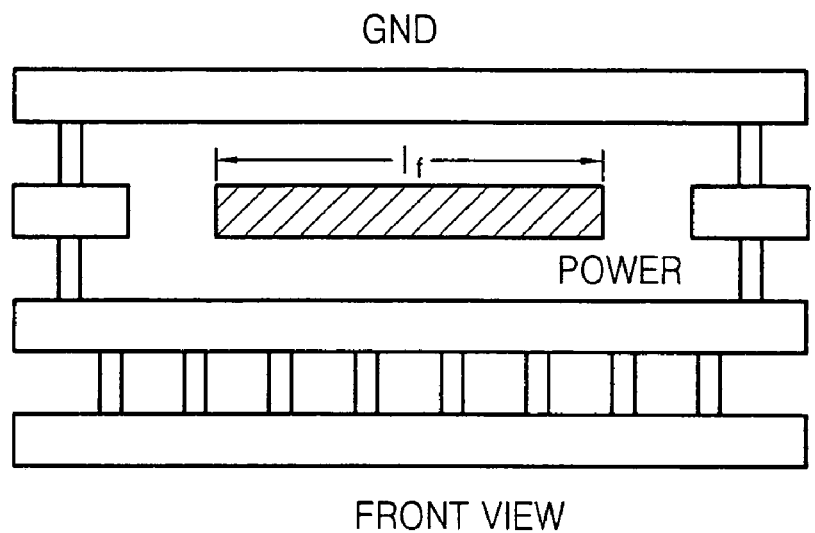
FIG. 17A is a front view of a metal I/O ring structure according to another embodiment of the present invention.
Figure 17B:
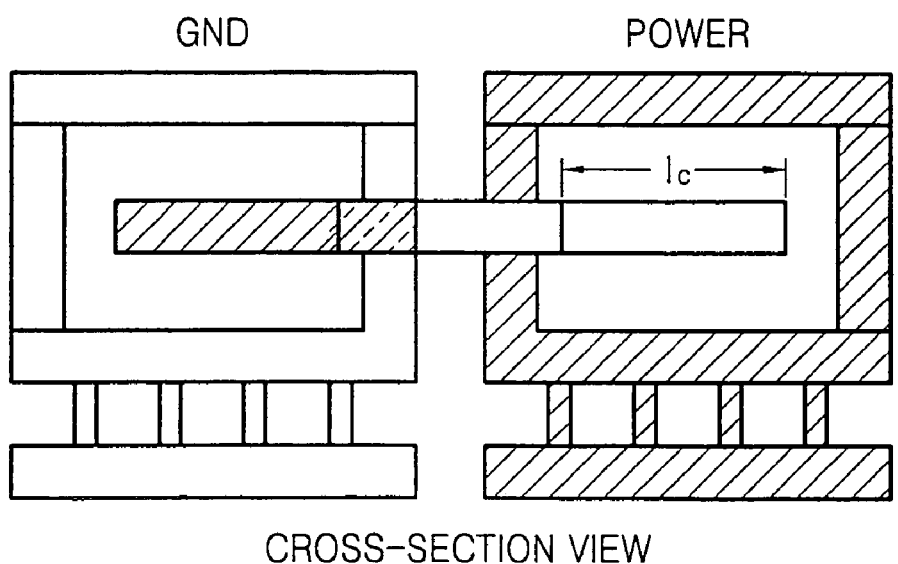
FIG. 17B is a cross-sectional view of the metal I/O ring structure shown in FIG. 17A; and, FIGS. 18A, 18B and 18C are a cross-sectional view of a metal I/O ring structure in a full semiconductor chip.

FIG. 17A is a front view of a metal I/O ring structure according to another embodiment of the present invention, and FIG. 17B is a cross-sectional view of the metal I/O ring structure shown in FIG. 17A.

Referring to FIGS. 17A and 17B, where a distance between metal layers has a constant value T with respect to a particular manufacturing process, decoupling capacitance can be expressed by the following equation EQ1.

$$C_D = 2 \cdot \varepsilon \frac{l_f \cdot l_c}{T}$$

In equation EQ1, $l_f$ is a width of a power metal line in FIG. 17A, and $l_c$ is a width of a power metal line in FIG. 17B. Since 'T' of equation EQ1 has a constant value with respect to a manufacturing process, particular decoupling capacitances can be obtained by making appropriate adjustments to $l_f$ and $l_c$.

FIG. 18 is a cross-sectional view of a metal I/O ring structure within the context of a full semiconductor chip. Although FIGS. 1 through 17 illustrate a single I/O cell, the present invention can be applied to a metal I/O ring in a full semiconductor chip as illustrated, for example, in FIG. 18.

Referring to FIG. 18, FIG. 18A illustrates a single I/O cell formed in the middle of a set of consecutive I/O cells illustrated in FIG. 18C. FIG. 18B illustrates a single cell formed on both ends of the set of consecutive I/O cells shown in FIG. 18C, and FIG. 18C illustrates a set of consecutively connected I/O cells formed by the single cells shown in FIGS. 18A and 18B, to which the metal ring structure of the present invention can be applied.

One advantage of the metal ring structure shown in FIG. 18 is that it has a larger capacitance than that of a single I/O cell.

As described above, a metal I/O ring for a semiconductor chip according to the present invention provides a sufficiently large decoupling capacitance and can also allow the decoupling capacitance to be adjusted to a desired size.

The foregoing preferred embodiments are teaching examples. Those of ordinary skill in the art will understand that various changes in form and details may be made to the exemplary embodiments without departing from the scope of the present invention which is defined by the following claims.

What is claimed is:

1. A metal input/output (I/O) ring structure for a semiconductor device, comprising:
    a first metal layer;
    a second metal layer located below the first metal layer;
    a plurality of power metal lines formed on the first metal layer and connected to a power supply;
    a plurality of ground metal lines formed on the first metal layer and connected to ground;
    a plurality of power metal lines formed on the second metal layer and connected to the power supply;
    a plurality of ground metal lines formed on the second metal layer and connected to ground; and,
    an insulating layer interposed between the first metal layer and the second metal layer, providing a decoupling capacitance between the power metal lines and the ground metal lines,
    wherein:
        the power metal lines and the ground metal lines on the first and second metal layers each comprise saw-toothed protrusions;
        wherein the saw-toothed protrusions of horizontally adjacent power metal lines and ground metal lines are interdigitated with each other;
        the saw-toothed protrusions of the power metal lines on the first metal layer are connected to the saw-toothed protrusions of the power metal lines on the second metal layer; and,
        the ground metal lines on the first metal layer and the ground metal lines on the second metal layer are connected to each other through groove spaces formed between the connected saw-toothed protrusions of the power metal lines on the first and second metal layers.

2. The metal I/O ring structure of claim 1, wherein each of the ground metal lines on the first and second metal layers is horizontally adjacent to at least one of the power metal lines, and vertically adjacent to at least one of the power metal lines.

3. The metal I/O ring structure of claim 2,
    wherein the ground metal lines on the first metal layer are connected to the ground metal lines on the second metal layer by a plurality of vias formed on the saw-toothed protrusions of the ground metal lines on the first and second metal layers; and,
    wherein the saw-toothed protrusions of the power metal lines on the first metal layer are connected to the saw-toothed protrusions of the power metal lines on the second metal layer by a plurality of vias formed on the saw-toothed protrusions of the power metal lines on the first and second metal layers.

4. The metal I/O ring structure of claim 2, wherein the ground metal lines and the power metal lines on the first and second metal layers are laid out in an alternating arrangement.

5. The metal I/O ring structure of claim 2, wherein the power metal lines on the first metal layer are connected with power metal lines on a third metal layer located below the second metal layer; and,
    the ground metal lines on the first metal layer are connected with ground metal lines on the third metal layer;
    wherein the power metal lines on the third metal layer are located below the ground metal lines on the second metal layer; and,
    wherein the ground metal lines on the third metal layer are located below the power metal lines on the second metal layer.

6. The metal I/O ring structure of claim 5, wherein the power metal lines or the ground metal lines on the first and third metal layers form a rectangular structure or a U shaped structure.

7. The metal I/O ring structure of claim 5, further comprising a plurality of metal layers formed below the third metal layer;
    wherein the metal lines formed on the third metal layer are connected with metal lines formed on a metal layer below the third metal layer through vias.

8. The metal I/O ring structure of claim 5, wherein the decoupling capacitance is controlled by adjusting a width and length of the power metal lines and the ground metal lines.

9. A semiconductor device having a metal I/O ring structure, the metal I/O ring structure comprising:
    a first metal layer;
    a second metal layer located below the first metal layer;
    a plurality of metal lines of a first type formed on the first metal layer;
    a plurality of metal lines of a second type formed on the first metal layer;
    a plurality of metal lines of the first type formed on the second metal layer;
    a plurality of metal lines of the second type formed on the second metal layer; and,
    an insulating layer interposed between the first metal layer and the second metal layer, thereby forming a decoupling capacitance between the metal lines of the first type and the metal lines of the second type;
    wherein each of the metal lines of the second type on the first and second metal layers is horizontally adjacent to at least one of the metal lines of the first type;
    wherein each of the metal lines of the second type on the first and second metal layers is vertically adjacent to at least one of the metal lines of the first type;
    wherein the metal lines on the first and second metal layers each comprise saw-toothed protrusions;
    wherein the saw-toothed protrusions of the metal lines of the first type on the first metal layer are connected to the saw-toothed protrusions of the metal lines of the first type on the second metal layer; and,
    wherein the metal lines of the second type on the first metal layer and the metal lines of the second type on the second metal layer are connected to each other through groove spaces formed between the connected saw-toothed protrusions of the metal lines of the first type.

10. The semiconductor device of claim 9, wherein the metal lines of the first type are connected to a power supply and the metal lines of the second type are connected to ground.

11. The semiconductor device of claim 10, wherein the metal lines of the first type on the first metal layer are connected to metal lines of the first type on the second metal layer through grooves formed at interfaces between horizontally adjacent metal lines.

12. The semiconductor device of claim 9,
wherein the metal lines of the second type on the first metal layer are connected to the metal lines of the second type on the second metal layer by a plurality of vias formed on the saw-toothed protrusions of the metal lines of the second type on the first and second metal layers; and,
wherein the saw-toothed protrusions of the metal lines of the first type on the first metal layer are connected to the saw-toothed protrusions of the metal lines of the first type on the second metal layer by a plurality of vias formed on the saw-toothed protrusions of the metal lines of the first type on the first and second metal layers.

13. The semiconductor device of claim 9, wherein the metal lines of the first type on the first metal layer are connected with metal lines of the first type on a third metal layer located below the second metal layer; and,
the metal lines of the second type on the first metal layer are connected with metal lines of the second type on the third metal layer;
wherein the metal lines of the first type on the third metal layer are located below the metal lines of the second type on the second metal layer; and,
wherein the metal lines of the second type on the third metal layer are located below the metal lines of the first type on the second metal layer.

14. The semiconductor device of claim 13, wherein the metal lines of the first type or the metal lines of the second type on the first and third metal layers form a rectangular structure or a U shaped structure.

15. The semiconductor device of claim 9, wherein the metal lines of the first and second types on the first and second metal layers are laid out in an alternating arrangement.

16. The semiconductor device of claim 9, wherein the metal I/O ring structure further comprises a plurality of metal layers located below the second metal layer;
wherein the plurality of metal layers have metal lines formed thereon, the metal lines of each of the plurality of metal layers being connected to the metal lines of vertically adjacent layers by vias.

17. The semiconductor device of claim 9, wherein the decoupling capacitance is controlled by adjusting a width and a length of the metal lines of the first type and the metal lines of the second type.

18. An on-chip decoupling capacitance structure, comprising:
a first region having an even layer on which a metal line of a first type is formed and an odd layer on which a metal line of a second type is formed;
a second region having an even layer on which a metal line of a second type is formed and an odd layer on which a metal line of the first type is formed; and,
an insulating layer interposed between the layers on which the metal lines are formed, whereby a decoupling capacitance is formed between the metal lines of the first type and the metal lines of the second type;
wherein the metal lines of the first type in the first and second regions are connected together and the metal lines of the second type in the first and second regions are connected together;
wherein the metal lines in the first and second regions each comprise saw-toothed protrusions;
wherein the saw-toothed protrusions of the metal line of the first type disposed in the first region are connected to the saw-toothed protrusions of the metal line of the first type disposed in the second region; and,
wherein the metal line of the second type disposed in the first region and the metal line of the second type disposed in the second region are connected to each other through groove spaces formed between the connected saw-toothed protrusions of the metal lines of the first type disposed in the first and second regions.

19. The on-chip decoupling capacitance structure of claim 18, wherein each of the first and second regions further comprises a lowermost and an uppermost metal layer;
wherein metal lines are formed on the uppermost and lowermost layers of the first and second regions; and
wherein the uppermost metal layer of the first region is of the same type as the lowermost metal layer of the first region and the uppermost metal layer of the second region is of the same type as the lowermost metal layer of the second region.

* * * * *